United States Patent
Tsai et al.

(10) Patent No.: US 8,390,049 B2
(45) Date of Patent: Mar. 5, 2013

(54) STRUCTURE OF SEMICONDUCTOR DEVICE

(75) Inventors: Shin-Chang Tsai, Hsinchu (TW);
Hsin-Fang Su, Hsinchu (TW);
Chun-Hung Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 215 days.

(21) Appl. No.: 12/288,632

(22) Filed: Oct. 21, 2008

(65) Prior Publication Data

US 2010/0096683 A1 Apr. 22, 2010

(51) Int. Cl.
*H01L 29/788* (2006.01)
(52) U.S. Cl. .............. 257/316; 257/317; 257/51.004; 365/185; 438/264
(58) Field of Classification Search ............ 257/317, 257/316, E51.004; 365/185; 438/264
See application file for complete search history.

(56) References Cited

U.S. PATENT DOCUMENTS

| | | | |
|---|---|---|---|
| 7,700,444 B2 * | 4/2010 | Chen | 438/279 |
| 2006/0128070 A1 * | 6/2006 | Park et al. | 438/128 |
| 2007/0004148 A1 * | 1/2007 | Yang | 438/264 |
| 2007/0258289 A1 * | 11/2007 | Lue | 365/185.18 |

FOREIGN PATENT DOCUMENTS

CN 1534789 10/2004
JP 2009212161 A * 9/2009

OTHER PUBLICATIONS

Chinese First Examination Report of China Application No. 200910126039.7, dated on Nov. 11, 2010.

\* cited by examiner

*Primary Examiner* — Kenneth Parker
*Assistant Examiner* — Dale E Page
(74) *Attorney, Agent, or Firm* — J.C. Patents

(57) ABSTRACT

A structure of a semiconductor device including a substrate and a patterned layer is provided. The patterned layer being patterned to have an open area and a dense area is disposed on the substrate. The patterned layer includes, in the dense area, a first pattern adjacent to the open area and a second pattern. The first pattern has a first bottom. The second pattern has a second bottom width. The bottom of the first pattern includes a recess facing the open area, so that the first bottom width is close to the second bottom width.

11 Claims, 10 Drawing Sheets

STRUCTURE OF SEMICONDUCTOR DEVICE

BACKGROUND OF THE INVENTION

1. Field of Invention

The present invention relates to a structure of a semiconductor device.

2. Description of Related Art

As the rapid development of semiconductor devices, high performance, high level of integration, low cost and slim shape have become the goals in designing electronic products. Accordingly, different devices with different functions are fabricated in one chip to meet the above-mentioned goals, so that the pattern density is varied in the same chip.

In the etching process, it is known that the etched profile is affected by the pattern density. Certain semiconductor devices, such as a non-volatile memory, have an open area and a dense area. Therefore, the profile of the edge pattern in the dense area is different from that of the other patterns in the same.

For example, the method of forming the non-volatile memory includes subsequently forming an oxide-nitride-oxide (ONO) composite layer, a polysilicon layer and a patterned photoresist layer on a substrate. Thereafter, an etching process is performed to the polysilicon layer, using the patterned photoresist layer as a mask, so as to form a patterned polysilicon layer having an open area and a dense area. During the step of forming the patterned polysilicon layer, polymers heavily accumulate on the open area, so that the pattern at the edge of the dense area has an inclined sidewall facing the open area, and the bottom width thereof is greater than that of the other patterns in the dense area. Further, the bottom width is proportional to the bottom area, and the bottom area plays an important role in the operation speed. Hence, different bottom widths result in different operation speeds, and errors may occur during the operation of erasing or programming.

SUMMARY OF THE INVENTION

Accordingly, the present invention provides a structure of a semiconductor device having a uniform bottom width across the dense area, so that the operation stability of the device is enhanced.

The present invention also provides a method of fabricating a semiconductor device that can prevent the device from being erased or programming incompletely due to different operation speeds resulted from different bottom widths.

The present invention provides a structure of a semiconductor device including a substrate and a patterned layer. The patterned layer being patterned to have an open area and a dense area is disposed on the substrate. The patterned layer includes, in the dense area, a first pattern adjacent to the open area and a second pattern. The first pattern has a first bottom width. The second pattern has a second bottom width. The bottom of the first pattern includes a recess facing the open area so that the first bottom width is close to the second bottom width.

According to an embodiment of the present invention, the first bottom width and the second bottom width are substantially the same.

According to an embodiment of the present invention, the first pattern further has a middle width of the middle portion thereof between the top thereof and the bottom thereof, and the middle width is the maximum width of the first pattern.

According to an embodiment of the present invention, the structure of the semiconductor device further includes a dielectric layer disposed between the substrate and the patterned layer.

According to an embodiment of the present invention, the dielectric layer can be an ONO composite layer.

According to an embodiment of the present invention, the patterned layer is a stacked structure including a floating gate, an inter-gate dielectric layer, and a control gate subsequently disposed on the substrate, and the structure of the semiconductor device further includes a tunnel dielectric layer between the substrate and the floating gate.

The present invention also provides a structure of a semiconductor device including a substrate and a patterned layer disposed on the substrate. The patterned layer has a first pattern, a second pattern and a third pattern, and the second pattern is between the first and the second patterns. The distance between the first pattern and the second pattern is smaller than the distance between the first pattern and the third pattern. The first pattern and the third pattern respectively have a first bottom width, a middle width, and a recess at a bottom facing each other so that the first bottom width is less than the middle width, and the first bottom width is close to the second bottom width of the second pattern.

According to an embodiment of the present invention, the first bottom width and the second bottom width are substantially the same.

According to an embodiment of the present invention, the middle width is the maximum width of the first pattern and the third pattern.

According to an embodiment of the present invention, the device further includes a dielectric layer disposed between the substrate and the patterned layer.

According to an embodiment of the present invention, the dielectric layer can be an ONO composite layer.

According to an embodiment of the present invention, the patterned layer is a stacked structure including a floating gate, an inter-gate dielectric layer, and a control gate subsequently disposed on the substrate, and the structure of the semiconductor device further includes a tunnel dielectric layer between the substrate and the floating gate.

The present invention further provides a semiconductor device including a substrate and a patterned layer disposed on the substrate. The patterned layer has an open area and a dense area. The patterned layer includes a first pattern disposed in the dense area and adjacent to the open area. The first pattern has an approximate even surface facing the dense area and an uneven surface facing the open area.

According to an embodiment of the present invention, the bottom of the first pattern includes a recess facing the open area, so that the bottom width of the first pattern is smaller than the middle width of the first pattern.

According to an embodiment of the present invention, the patterned layer further includes a plurality of second patterns beside the first pattern in the dense area, and each of the second patterns has approximate even surfaces.

According to an embodiment of the present invention, the bottom of the first pattern includes a recess facing the open area, so that the bottom width of the first pattern is close to the bottom width of each of the second patterns.

According to an embodiment of the present invention, the device further includes a dielectric layer disposed between the substrate and the patterned layer.

According to an embodiment of the present invention, the dielectric layer can be an ONO composite layer.

According to an embodiment of the present invention, the patterned layer is a stacked structure including a floating gate, an inter-gate dielectric layer, and a control gate subsequently disposed on the substrate, and the structure of the semiconductor device further includes a tunnel dielectric layer between the substrate and the floating gate.

In the present invention, the semiconductor device has a recess formed at the bottom of the edge pattern in the dense area, so that the bottom width of the edge pattern is close to, or even substantially equal to, that of the other patterns in the dense area. Hence, the device features such as operation speed can be substantially the same across the device, and the problem of erasing or programming incompletely is solved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
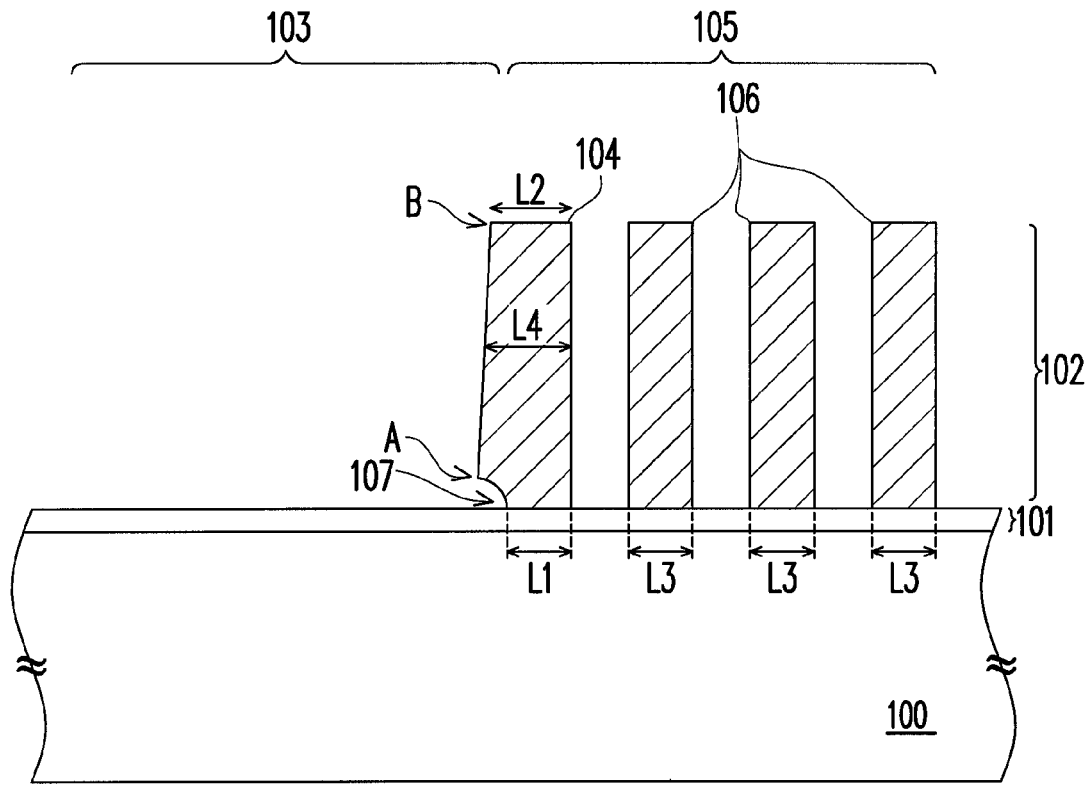
FIG. 1A schematically illustrates a cross-section view of a structure of a semiconductor device according to an embodiment of the present invention.
Figure 1B:
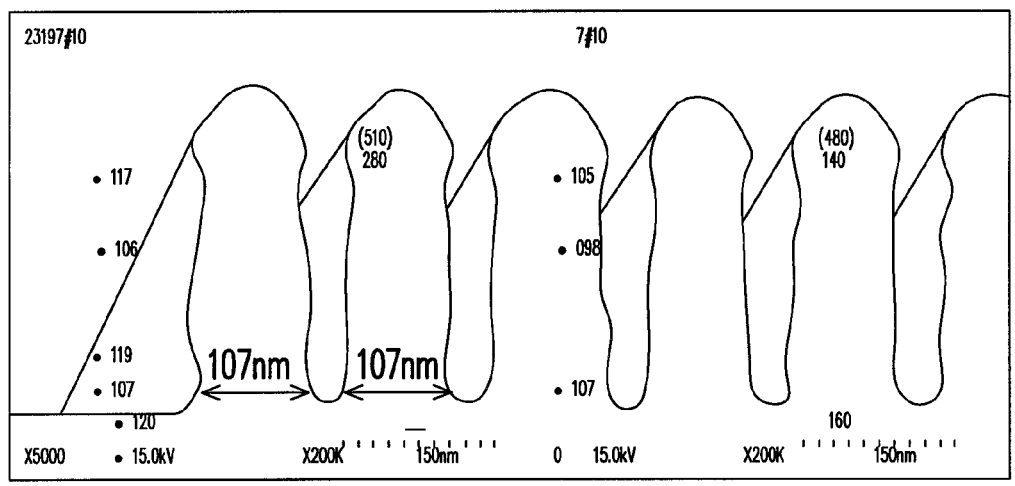
FIG. 1B is a scanning electron microscope (SEM) picture of a structure of a semiconductor device according to an embodiment of the present invention.

FIG. 1A schematically illustrates a cross-section view of a structure of a semiconductor device according to an embodiment of the present invention. FIG. 1B is a scanning electron microscope (SEM) picture of a structure of a semiconductor device according to an embodiment of the present invention.

Referring to FIG. 1A, a structure of a semiconductor device includes a substrate 100 and a patterned layer 102. The substrate 100 can be a semiconductor substrate, such as a silicon substrate. The patterned layer 102 is disposed on the substrate 100. In an embodiment, the patterned layer 102 can be a dielectric layer. In another embodiment, the patterned layer can be a conductive layer including metal, polysilicon, polycide or metal salicide, and the structure of the semiconductor device further includes a dielectric layer 101 disposed between the substrate 100 and the patterned layer 102. For example, the dielectric layer 101 can be a composite layer or a multi-layer such as an ONO layer that includes a bottom oxide layer, a nitride layer and a top oxide layer, and the patterned layer 102 can be a polysilicon layer. In another embodiment, the patterned layer 102 can be a stacked structure such as a memory gate structure that includes a floating gate, an inter-gate dielectric layer, and a control gate subsequently disposed on the substrate 100, and the dielectric layer 101 can be a tunnel dielectric layer, such as an oxide layer.

The patterned layer 102 is patterned to have an open area 103 and a dense area 105. The patterned layer 102 includes, in the dense area 105, a pattern 104 and a plurality of patterns 106. The pattern 104 is disposed adjacent to the open area 103. The patterns 106 are disposed beside the pattern 104. The pattern 104 has a bottom width L1 and a top width L2. The pattern 104 further has a middle width L4 of the middle portion thereof between the top thereof and the bottom thereof, and the middle width L4 is the maximum width of the pattern 104. Further, each of the patterns 106 has a bottom width L3. It is noted that L1 is smaller than L4 (L1<L4), L2 is smaller than L4, and L1 is close to, or even substantially equal to, L3 (L1~L3). In details, the bottom of the pattern 104 includes a recess 107 facing the open area 103, and the width at the recess 107 denotes as the bottom width L1 of the pattern 104.

In other words, the pattern 104 has an approximate even surface facing the dense area 105 and an uneven surface facing the open area 103, and each of the patterns 106 has approximate even surfaces. The bottom of the pattern 104 includes the recess 107 facing the open area 103 so that the bottom width L1 of the pattern 104 is smaller than the middle width L4 of the same, and the bottom width L1 of the pattern 104 is close to, or even substantially equal to, the bottom width L3 of each pattern 106. The uneven surface of the pattern 104 facing the open area 103 is slightly inclined from the top (point A) of the recess 107 to the top (point B) of the pattern 104.

In the present invention, the bottom of the pattern 104 is modified by the recess 107, so that the bottom width L1 of the pattern 104 is close to, even substantially equal to, the bottom width L3 of each pattern 106; and thus the bottom area of the pattern 104 projected on the substrate 100 is similar to that of each pattern 106 projected on the substrate 100. Therefore, errors in operation speeds resulted from different projected areas (or different bottom widths) of the conventional semiconductor device are not observed. In other words, due to the uniform bottom width across the semiconductor device of the present invention, the operation stability of the device is significantly enhanced.

In an embodiment, the present invention is applicable to the process of fabricating a dense area having a uniform bottom width of 107 nm. Referring to FIG. 2B, the bottom of the edge pattern (on the left side of the picture) in the dense area has a recess facing the open area. Therefore, zero bias is present between the bottom width at the recess of the edge pattern and the bottom width of the other patterns in the dense area. The picture proves that a uniform bottom width across the dense area of the device is feasible.

The above-mentioned embodiments including an open area and a dense area are provided for illustration purposes, and are not to be construed as limiting the present invention. The number of the open areas and the number of the dense areas are not limited by the present invention. The following embodiment is illustrated by exemplifying two dense areas beside the open area.

Figure 1C:
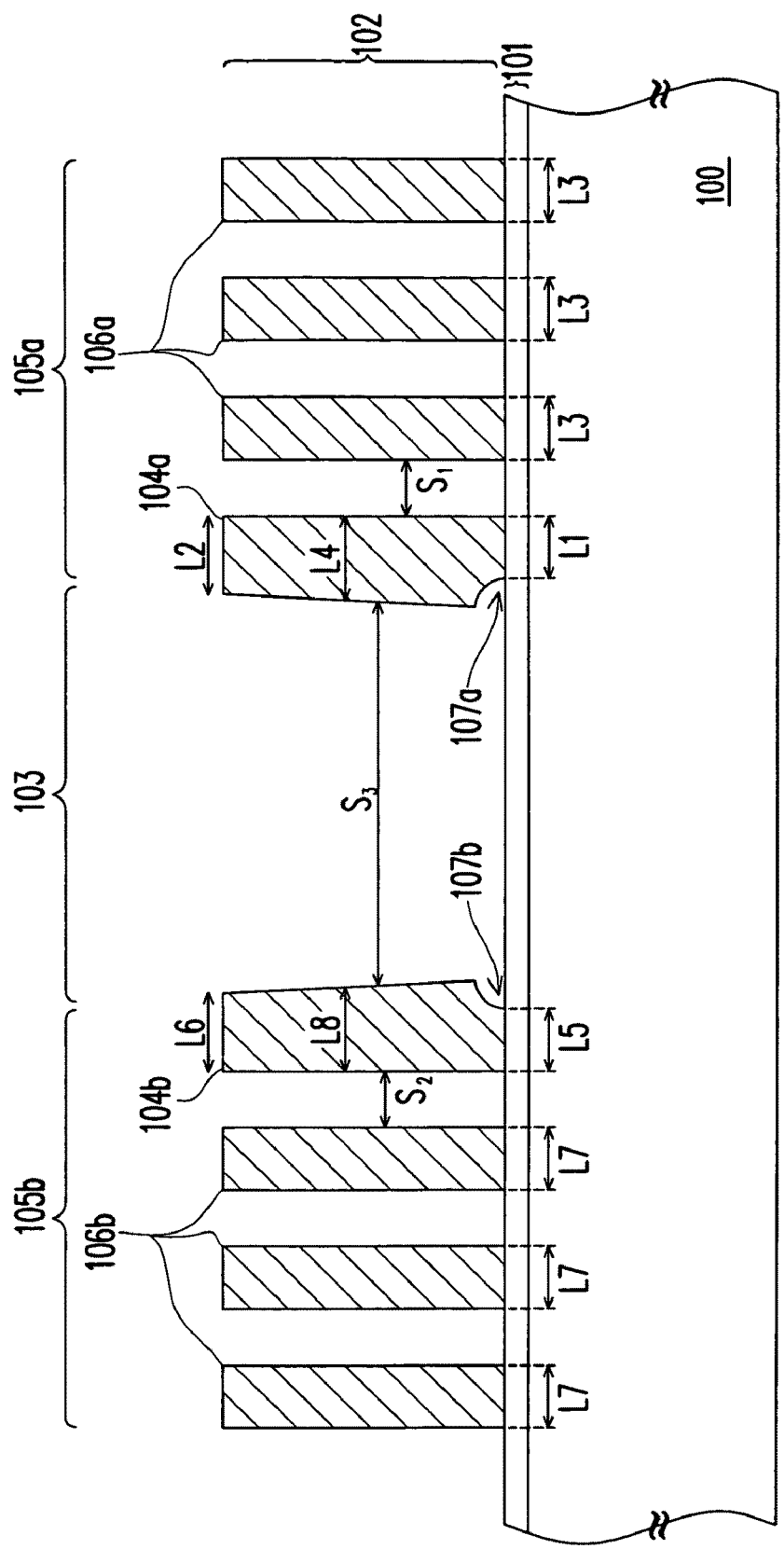
FIG. 1C schematically illustrates a cross-section view of a structure of a semiconductor device according to another embodiment of the present invention.

FIG. 1C schematically illustrates a cross-section view of a structure of a semiconductor device according to another embodiment of the present invention. This embodiment in FIG. 1C is similar to the embodiment in FIG. 1A, so that the details are not iterated, and the difference is described in the following.

The patterned layer 102 is patterned to have an open area 103 and two dense areas 105a and 105b beside the open area 103. The patterned layer 102 includes, in the dense area 105a, a pattern 104a and a plurality of patterns 106a. The pattern 104a is disposed adjacent to the open area 103. The patterns 106a are disposed beside the pattern 104a. The pattern 104a and the patterns 106a are spaced apart by a distance S1. The dense area 105b includes a pattern 104b and a plurality of patterns 106b. The pattern 104b is disposed adjacent to the open area 103. The patterns 106b are disposed beside the pattern 104b. The pattern 104b and the patterns 106b are spaced apart by a distance S2.

Further, the patterns 104a and 104b are spaced apart by a distance S3, and S3 is greater than S1 or S2. In an embodiment, S1 is substantially equal to S2, so that S3>S1~S2. In another embodiment, S1 is different from S2, so that S3>S1, S3>S2, but S1≠S2.

The pattern 104a has a bottom width L1, a middle width L4 and a top width L2, and each of the patterns 106a has a bottom width L3, wherein L1<L4, L2<L4 and L1~L3. In details, the bottom of the pattern 104a includes a recess 107a facing the open area 103 (or facing the pattern 104b), and the width at the recess 107a denote as the bottom width L1 of the pattern 104a, and thus L1~L3. The sidewall of the pattern 104a facing the open area 103 is slightly inclined from the top of the recess 107a to the top of the pattern 104a.

The pattern 104b has a bottom width L5, a middle width L8 and a top width L6, and each of the patterns 106b has a bottom width L7, wherein L5<L8, L6<L8 and L5~L7. In details, the bottom of the pattern 104b includes a recess 107b facing the open area 103 (or facing the pattern 104a), and the width at the recess 107b denote as the bottom width L5 of the pattern 104b, and thus L5~L7. The sidewall of the pattern 104b facing the open area 103 is slightly inclined from the top of the recess 107b to the top of the pattern 104b.

In an embodiment, the bottom width in the dense area 105a is substantially equal to the bottom width in the dense area 105b; that is, L1~L3~L5~L7. In other words, the bottom area of each of the patterns 104a and 104b projected on the substrate 100 is similar to that of each of the patterns 106a and 106b projected on the substrate 100. Therefore, the operation stability of the device is significantly enhanced due to the uniform bottom width across the device. It is for sure that the bottom width in the dense area 105a can be different from the bottom width in the dense area 105b (L1~L3≠L5~L7) upon the design requirement.

Several memory structures are provided in the following embodiments. It is appreciated by persons skilled in the art that the following embodiments are provided for illustration purposes and are not to be construed as limiting the present invention. The present invention can be applicable to a logic device or an embedded process such as embedded flash (e-flash), as long as the spirit and scope of the present invention are not deviated.

First Embodiment

Figure 2A:
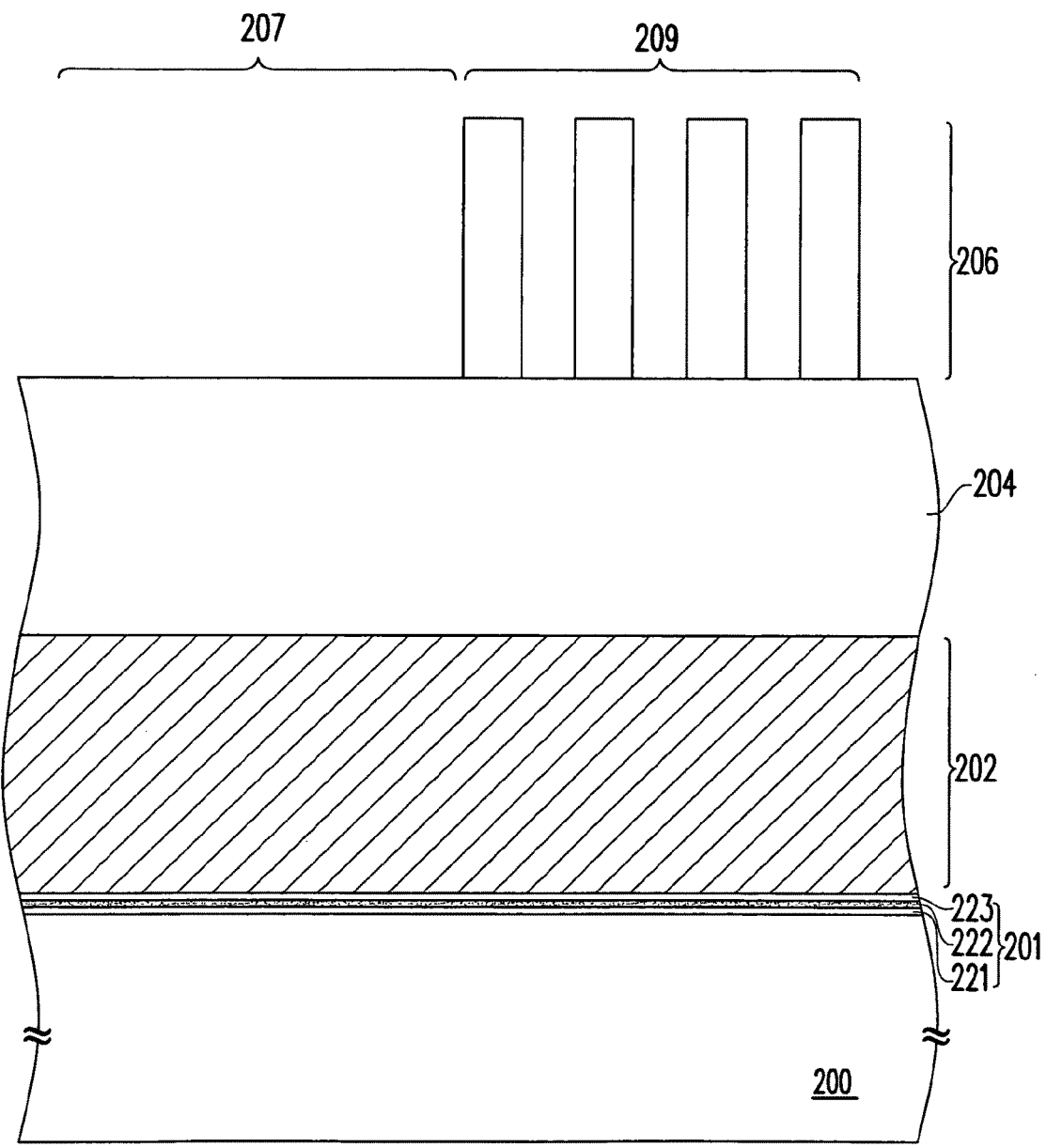
FIGS. 2A to 2C schematically illustrate cross-section views of a method of fabricating a semiconductor device according to the first embodiment of the present invention.
Figure 2B:
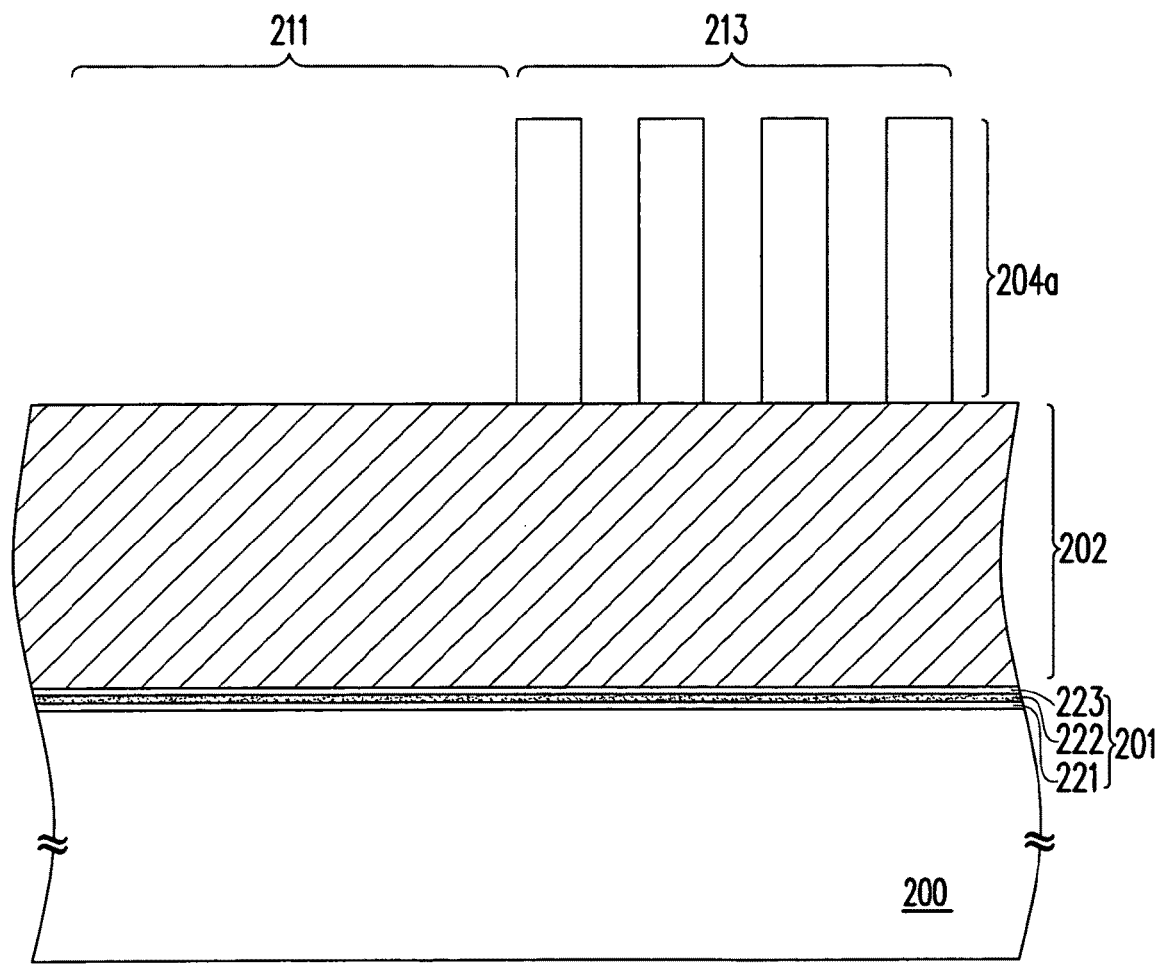
Figure 2C:
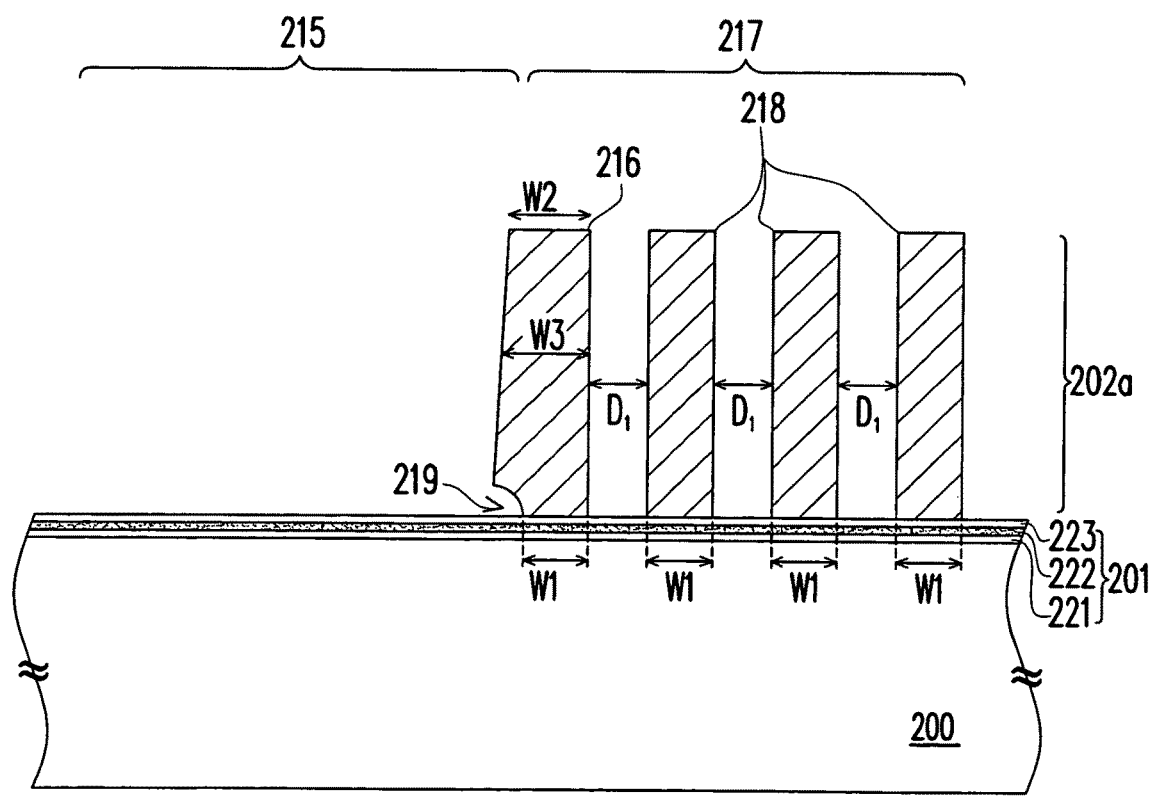

FIGS. 2A to 2C schematically illustrate cross-section views of a method of fabricating a semiconductor device according to the first embodiment of the present invention.

Referring to FIG. 2A, a substrate 200 is provided. Thereafter, a dielectric layer 201 is formed on the substrate 200. The dielectric layer 201 is, for example, an ONO composite layer including a bottom oxide layer 221, a nitride layer 222, and a top oxide layer 223 subsequently formed on the substrate 200. The bottom oxide layer 221 can be formed through thermal oxidation or chemical vapor deposition (CVD). The nitride layer 222, which is to be defined into a charge trapping layer, can be formed through low-pressure CVD (LPCVD) or plasma-enhanced CVD (PECVD). The top oxide layer 223 can be formed through surface oxidation of the nitride layer 222 or through CVD.

Afterwards, a target layer 202 is formed on the dielectric layer 201. The target layer 202 can be a polysilicon layer formed through CVD, for example. A mask layer 204 is then formed on the target layer 202. The mask layer 204 includes silicon nitride (SiN), silicon oxide (SiO) or silicon oxynitride (SiON), for example. The method of forming the mask layer 204 includes CVD, for example. Thereafter, a patterned photoresist layer 206 is formed on the mask layer 204. The patterned photoresist layer 206 has an open area 207 and a dense area 209.

Referring to FIG. 2B, an etching process is performed to the mask layer 204, using the patterned photoresist layer 206 as a mask, so as to form a patterned mask layer 204a. The patterned mask layer 204a has an open area 211 and a dense area 213. Thereafter, the patterned photoresist layer 206 is removed.

Referring to FIG. 2C, an etching process is performed to the target layer 202, using the patterned mask layer 204a as a mask, so as to form a patterned layer 202a. The step of forming the patterned layer 202a includes a main etching step, a recess etching step and an over-etching step. The parameters of the main etching step include a pressure of about 5~200 mT, a top plate power of about 100~2000 W, a bottom plate power of about 0~500 W, a $CF_4$ flow rate of about 0~50 sccm, a HBr flow rate of about 0~1000 sccm, an $O_2$ flow rate of about 0~50 sccm and an end-point time. The parameters of the recess etching step include a pressure of about 5~200 mT, a top plate power of about 100~2000 W, a bottom plate power of about 0~500 W, a $CF_4$ flow rate of about 0~50 sccm, a HBr flow rate of about 0~1000 sccm, an $O_2$ flow rate of about 0~50 sccm and an end-point time. The parameters of the over-etching step include a pressure of about 5~200 mT, a top plate power of about 100~2000 W, a bottom plate power of about 0~500 W, a HBr flow rate of about 0~1000 sccm, an $O_2$ flow rate of about 0~50 sccm, a He flow rate of about 0~500 sccm, a He—$O_2$ flow rate of about 0~100 sccm and a time of about 30~240 seconds.

The patterned layer 202a has an open area 215 and a dense area 217. The dense area 217 includes a pattern 216 and a plurality of patterns 218. The pattern 216 is formed adjacent to the open area 215. The patterns 218 are formed beside the pattern 216. The pattern 216 and the patterns 218 are spaced apart by a distance D1, and the patterns 218 are also spaced apart by the same distance D1. The pattern 216 has a bottom width W1, a middle width W3 and a top width W2. Further, each of the patterns 218 has a bottom width ~W1. It is noted that W1<W3, W2<W3, and a uniform bottom width ~W1 across the pattern 216 and patterns 218. In details, the recess etching step includes forming a recess 219 facing the open area 215 at the bottom of the pattern 216, and the width at the recess 219 is the bottom width W1 of the pattern 216.

In this embodiment, during the patterning process of the target layer 202, the polymer accumulation on the open area 215 is much less than the conventional method, because the etching mask of the patterned mask layer 204a replaces the conventional patterned photoresist layer. Further, the high pressure of 20 mT, a top plate power of about 500 W, a bottom plate power of about 70 W, and less polymer gas such as $CF_4$ flow rate of 20 sccm and $O_2$ flow rate of 5 sccm are applied in the recess etching step, so that the bottom profile of the pattern 216 at the edge of the dense area 217 is different from that of the other patterns 218 in the dense area 217.

Second Embodiment

Figure 3A:
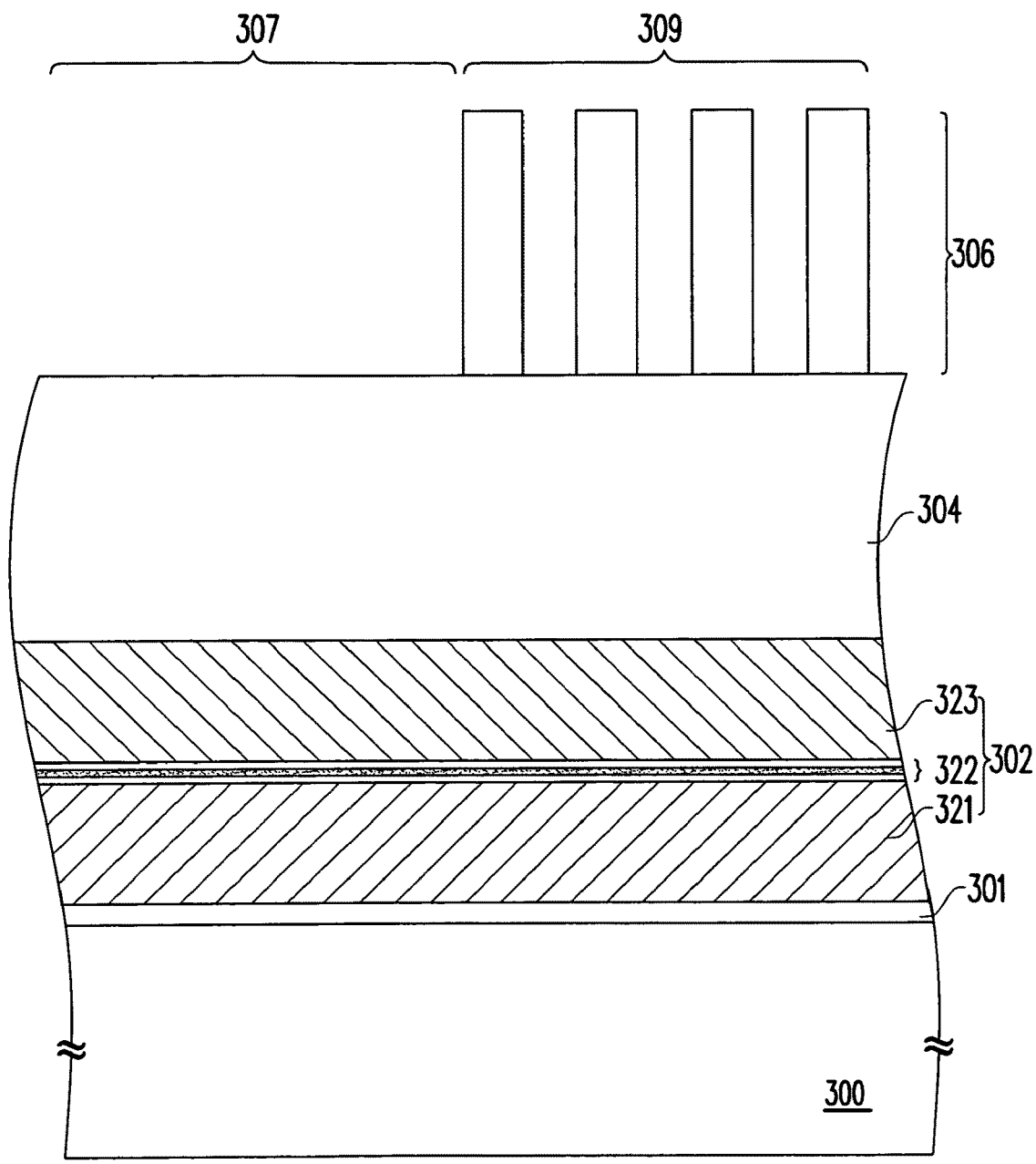
FIGS. 3A to 3C schematically illustrate cross-section views of a method of fabricating a semiconductor device according to the second embodiment of the present invention.
Figure 3B:
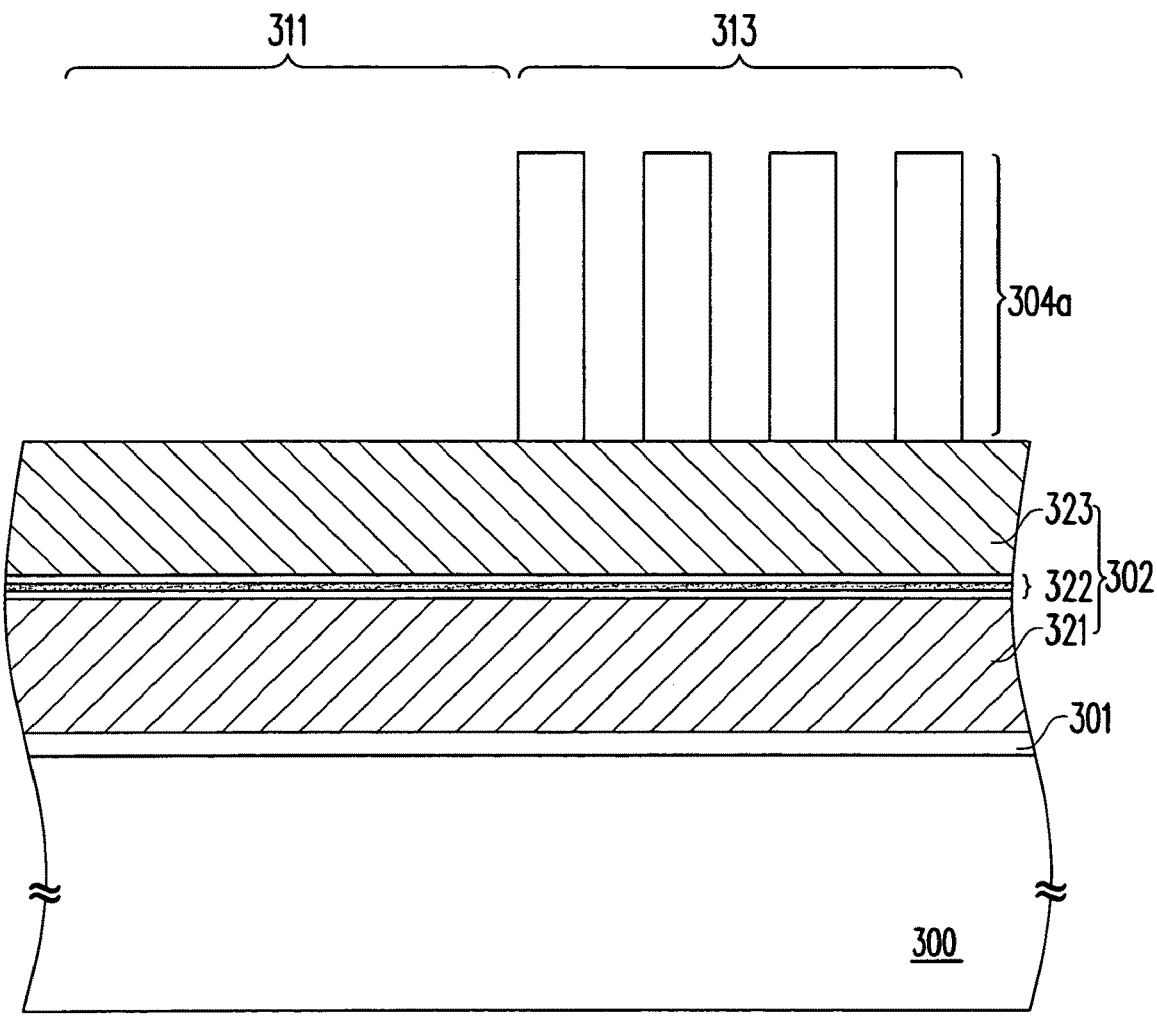
Figure 3C:
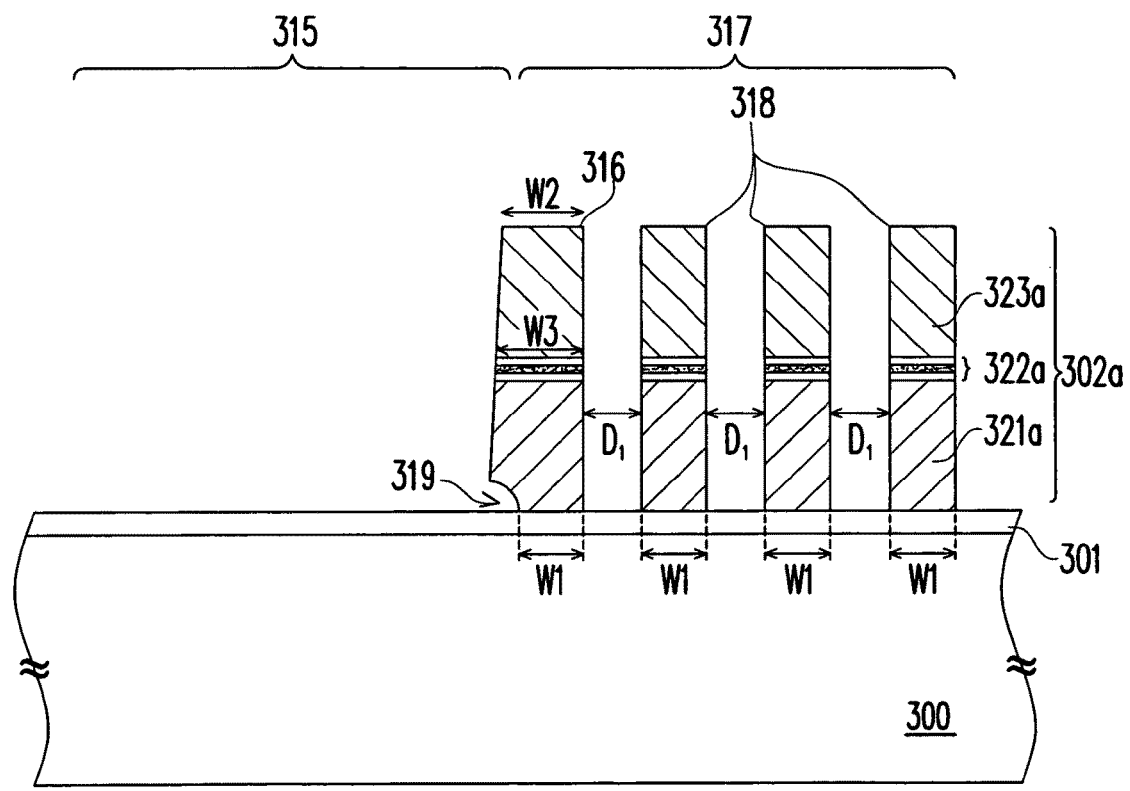

FIGS. 3A to 3C schematically illustrate a cross-section view of a method of fabricating a semiconductor device according to the second embodiment of the present invention.

Referring to FIG. 3A, a substrate 300 is provided. Thereafter, a dielectric layer 301 is formed on the substrate 300. The dielectric layer 301 is, for example, a tunnel dielectric layer formed through thermal oxidation. Afterwards, a target layer 302 is formed on the dielectric layer 301. The target layer 302 can be a stacked structure including a conductive layer 321, a dielectric layer 322 and a conductive layer 323 sequentially formed on the dielectric layer 301. The conductive layers 321 and 323 include polysilicon, for example. The dielectric layer 322 can be an ONO composite layer. The method of forming the conductive layer 321, the dielectric layer 322 and the conductive layer 323 includes CVD, for example.

A mask layer 304 is then formed on the target layer 302. The mask layer 304 includes SiN, SiO or SiON, for example. The method of forming the mask layer 304 includes CVD, for example. Thereafter, a patterned photoresist layer 306 is formed on the mask layer 304. The patterned photoresist layer 306 has an open area 307 and a dense area 309.

Referring to FIG. 3B, an etching process is performed to the mask layer 304, using the patterned photoresist layer 306 as a mask, so as to form a patterned mask layer 304a. The patterned mask layer 304a has an open area 311 and a dense area 313. Thereafter, the patterned photoresist layer 306 is removed.

Referring to FIG. 3C, an etching process is performed to the target layer 302, using the patterned mask layer 304a as a mask, so as to form a patterned layer 302a. The step of forming the patterned layer 302a includes a main etching step, a recess etching step and an over-etching step. The parameters of the main etching step include a pressure of about 5~200 mT, a top plate power of about 100~2000 W, a bottom plate power of about 0~500 W, a $CF_4$ flow rate of about 0~50 sccm, a HBr flow rate of about 0~1000 sccm, an $O_2$ flow rate of about 0~50 sccm and an end-point time. The parameters of the recess etching step include a pressure of about 5~200 mT, a top plate power of about 100~2000 W, a bottom plate power of about 0~500 W, a $CF_4$ flow rate of about 0~50 sccm, a HBr flow rate of about 0~1000 sccm, an $O_2$ flow rate of about 0~50 sccm and an end-point time. The parameters of the over-etching step include a pressure of about 5~200 mT, a top plate power of about 100~2000 W, a bottom plate power of about 0~500 W, a HBr flow rate of about 0~1000 sccm, an $O_2$ flow rate of about 0~50 sccm, a He flow rate of about 0~500 sccm, a He—$O_2$ flow rate of about 0~100 sccm and a time of about 30~240 seconds.

The patterned layer 302a includes a patterned conductive layer 321a, a patterned dielectric layer 322a and a patterned conductive layer 323a, wherein the patterned conductive layer 321a serves a floating gate, the patterned dielectric layer 322a serves as an inter-gate dielectric layer, and the patterned conductive layer 323a serves as a control gate. The patterned layer 302a has an open area 315 and a dense area 317. The dense area 317 includes a pattern 316 and a plurality of patterns 318. The pattern 316 is formed adjacent to the open area 315. The patterns 318 are formed beside the pattern 316. The pattern 316 and the patterns 318 are spaced apart by a distance D1, and the patterns 318 are also spaced apart by the same distance D1. The pattern 316 has a bottom width is W1, a middle width W3 and a top width W2. Further, each of the patterns 318 has a bottom width ~W1. It is noted that W1<W3, W2<W3, and a uniform bottom width ~W1 across the pattern 316 and patterns 318. In details, the recess etching step includes forming a recess 319 facing the open area 315 at the bottom of the pattern 316, and the width at the recess 319 is the bottom width W1 of the pattern 316. Specially, the recess 319 is formed at the bottom of the patterned conductive layer 321a of the patterned layer 302a.

Third Embodiment

Figure 4:
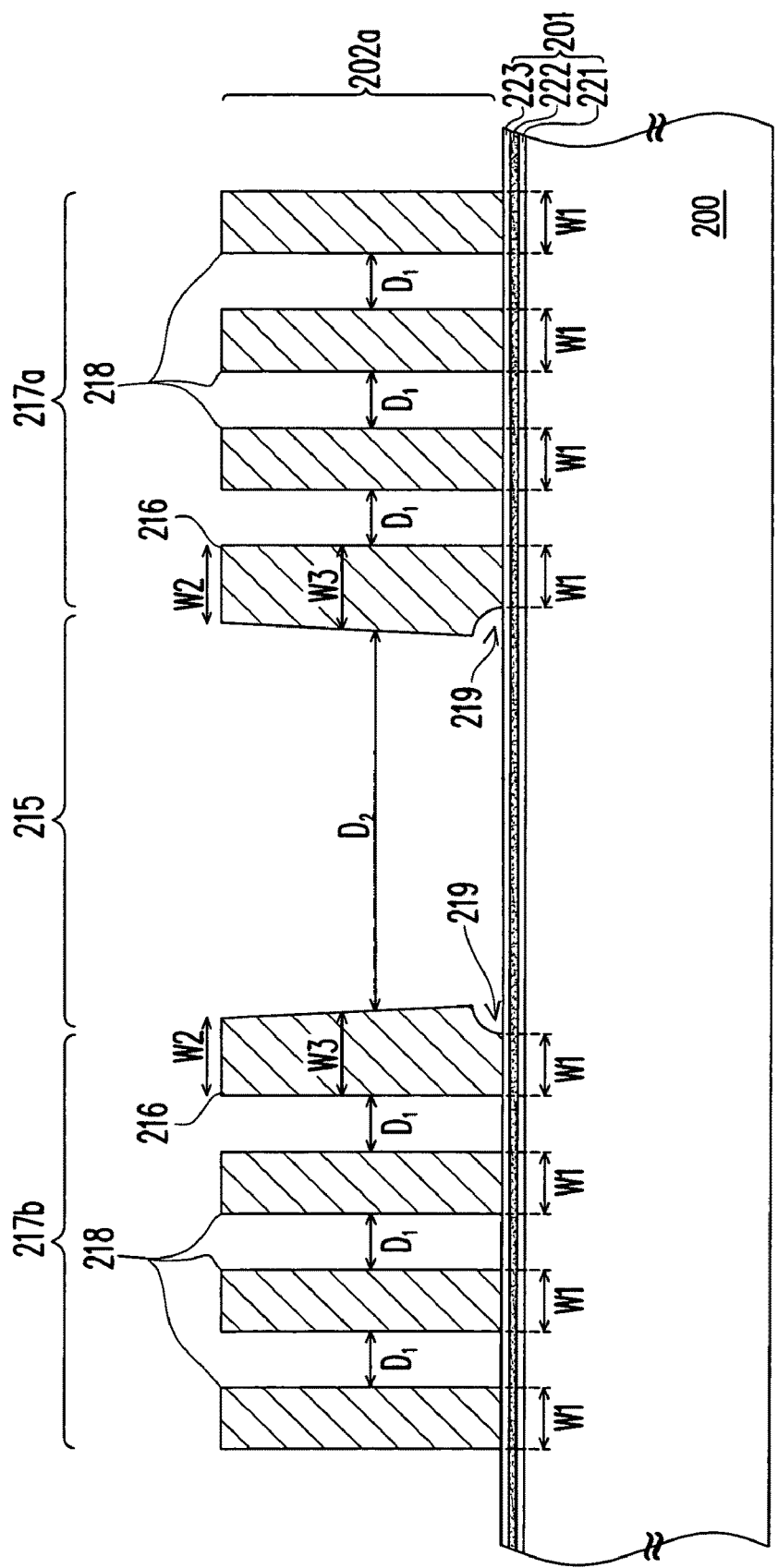
FIG. 4 schematically illustrates a cross-section view of a structure of a semiconductor device according to the third embodiment of the present invention.

FIG. 4 schematically illustrates a cross-section view of a structure of a semiconductor device according to the third embodiment of the present invention. The material and methods of forming the third embodiment are similar to those of the first embodiment, and thus the details are not iterated. The difference between the first and third embodiments will be described in the following.

Referring to FIG. 4, the patterned layer 202a has an open area 215 and two dense areas 217a and 217b beside the open area 215. The dense areas 217a and 217b of the third embodiment are similar to the dense area 217 of the first embodiment. It is noted that the dense area 217a is mirror-symmetrical to the dense area 217b, the pattern 216 in the dense area 217a and the pattern 216 in the dense area 217b are spaced apart by a distance D2, and D2>D1.

Fourth Embodiment

Figure 5:
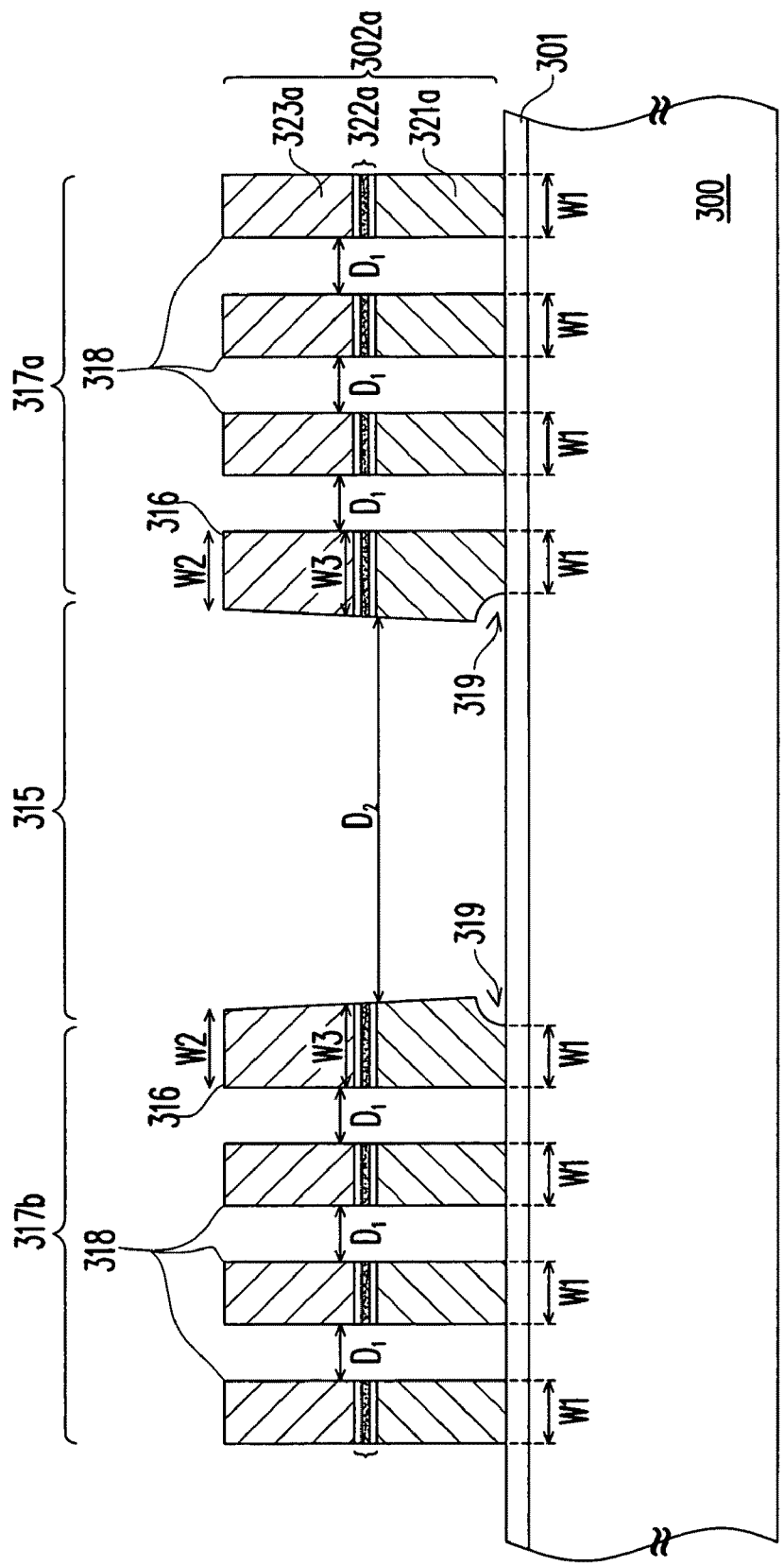
FIG. 5 schematically illustrates a cross-section view of a structure of a semiconductor device according to the fourth embodiment of the present invention.

FIG. 5 schematically illustrates a cross-section view of a structure of a semiconductor device according to the fourth embodiment of the present invention. The material and methods of forming the fourth embodiment are similar to those of the second embodiment, and thus the details are not iterated. The difference between the second and fourth embodiment will be described in the following.

Referring to FIG. 5, the patterned layer 302a has an open area 315 and two dense areas 317a and 317b beside the open area 315. The dense areas 317a and 317b of the fourth embodiment are similar to the dense area 317 of the second embodiment. It is noted that the dense area 317a is mirror-symmetrical to the dense area 317b, the pattern 316 in the dense area 317a and the pattern 316 in the dense area 317b are spaced apart by a distance D2, and D2>D1.

In summary, the semiconductor device of the present invention has a recess formed at the bottom of the edge pattern in the dense area, so that the bottom width of the edge pattern is substantially equal to that of the other patterns in the dense area. Hence, the operation speed is substantially the same across the device, and the stability of the device is significantly enhanced. Further, the fabrication method is simple without specially designed mask or additional process step, so that the cost is greatly saved and the competitiveness is significantly improved.

This invention has been disclosed above in the preferred embodiments, but is not limited to those. It is known to persons skilled in the art that some modifications and innovations can be made without departing from the spirit and scope of this invention. Hence, the scope of this invention should be defined by the following claims.

What is claimed is:

1. A structure of a semiconductor device, comprising:
   a semiconductor substrate having a first area and a second area; and
   a patterned layer, disposed on the semiconductor substrate, and comprising a plurality of nanometer-scale first patterns disposed in the first area and adjacent to the second area, wherein an edge pattern of the plurality of first patterns has an even surface from top to bottom facing the other first patterns, and an uneven surface from top to bottom facing the second area, and the second area has no pattern formed thereon.

2. The structure of claim 1, wherein a bottom of the edge pattern comprises a recess facing the second area so that a bottom width of the edge pattern is smaller than a middle width of the edge pattern.

3. The structure of claim 1, wherein each of the other first patterns has even surfaces.

4. The structure of claim 3, wherein a bottom width of the edge pattern is the same as a bottom width of each of the other first patterns.

5. The structure of claim 1, further comprising a dielectric layer disposed between the substrate and the patterned layer.

6. The structure of claim 5, wherein the dielectric layer comprises an ONO composite layer.

7. The structure of claim 1, wherein the patterned layer is a stacked structure comprising a floating gate, an inter-gate dielectric layer, and a control gate subsequently disposed on the substrate, further comprising a tunnel dielectric layer between the substrate and the floating gate.

8. The structure of claim 1, wherein a top surface of the second area and a top surface of the first area have same height.

9. The structure of claim 1, wherein a distance from a first edge of the first area to a second edge of the first area is larger than a width of a space between the other first patterns and the edge pattern.

10. The structure of claim 1, wherein a distance between the edge pattern and the other first patterns is smaller than a distance between the edge pattern and a second pattern in a third area, wherein the first area is sandwiched in between the third area and the second area.

11. A structure of a semiconductor device, comprising:
a semiconductor substrate; and
a plurality of nanometer-scale patterns disposed on the semiconductor substrate, and comprising an edge pattern and a plurality of the other patterns, wherein
the edge pattern and the other patterns have their respective bottom portions that are separated from each other,
a width of the bottom portion of the edge pattern is the same as that of the bottom portion of each of the other patterns, and
a middle width of the edge pattern is larger than that of each of the other patterns.

* * * * *